United States Patent [19]

Yoshida

[11] 4,173,739
[45] Nov. 6, 1979

[54] OVERLOAD DETECTING CIRCUIT FOR A PWM AMPLIFIER

[75] Inventor: Tadao Yoshida, Tokyo, Japan
[73] Assignee: Sony Corporation, Tokyo, Japan
[21] Appl. No.: 943,139
[22] Filed: Sep. 18, 1978
[30] Foreign Application Priority Data
Sep. 20, 1977 [JP] Japan .................................. 52-112912
[51] Int. Cl.² .............................................. H03F 3/04
[52] U.S. Cl. ................................ 330/298; 330/207 A; 330/207 P; 330/251
[58] Field of Search .................... 330/207 P, 298, 251, 330/207 A; 361/101

[56] References Cited
U.S. PATENT DOCUMENTS

| | | | |
|---|---|---|---|
| 3,526,846 | 9/1970 | Campbell | 330/207 A X |
| 3,998,694 | 10/1976 | Yamazaki | 330/298 X |
| 4,047,120 | 9/1977 | Lord et al. | 330/207 A X |
| 4,061,983 | 12/1977 | Suzuki | 330/298 X |

Primary Examiner—Lawrence J. Dahl
Attorney, Agent, or Firm—Hill, Van Santen, Steadman, Chiara & Simpson

[57] ABSTRACT

An overload detecting circuit for a PWM amplifier includes an output current detecting circuit and an output voltage detecting circuit. The output of the output voltage detecting circuit is supplied to a rectifying circuit having a discharge time constant determined by the cut-off frequency of a low pass filter as a demodulator of the PWM amplifier. A comparison circuit is provided to produce an overload indicative signal in response to the comparison result between the outputs of the rectifying circuit and of the output current detecting circuit.

8 Claims, 2 Drawing Figures

OVERLOAD DETECTING CIRCUIT FOR A PWM AMPLIFIER

BACKGROUND OF THE INVENTION

1. Field of the Invention

This invention relates to an overload detecting circuit for an amplifier and, particularly to an overload detecting circuit which is preferably used for a PWM amplifier to produce an amplified output by means of pulse width modulation in response to an input signal.

2. Description of the Prior Art

A transistor output amplifier being of class-D type is converted into a pulse-width-modulated signal (PWM signal), a switching element being controlled in ON-OFF state in response to the PWM signal, and the switching output being demodulated through a filter to derive an amplified output signal.

When, for example, a speaker unit having a lower input impedance than a rating of the amplifier is connected as a load, or the output terminals of the amplifier are shorted, the amplifier runs into an overload condition. The current flowing through the switching element exceeds rated value of the amplifier, so that the switching device is in danger of being broken down.

Therefore, the amplifier needs an overload detecting circuit for protecting the switching element. A such conventional overload detecting circuit operates in the manner that the current flowing through the switching element is detected, and when the detecting current exceeds a rated value, the input signal is attenuated or the PWM signal to the switching element is cut off. The detecting circuit detects the current flowing through the switching element. The detecting current is larger than the rated maximum permissible current of the switching element. Thus, when such a trouble that the output terminals are shorted occurs, a current larger than the rated maximum permissible current flows through the switching element. The current causes a large quantity of loss such as generation of heat, until an overload protecting means operates.

Further, the filter to which the output of the switching element is supplied to demodulate the PWM signal, consists of an inductor and a capacitor. The switching current induces a counter electromotive force, which causes a reverse current. The reverse current flows through a discharge diode. Thus, in the amplifier using such an overload detecting circuit, the reverse current flowing through the diode becomes larger in accordance with the maximum output current of the amplifier under the overload condition thereof, which results in generation of a large quantity of power loss in the diode.

SUMMARY OF THE INVENTION

Accordingly, it is an object of this invention to provide an overload detecting circuit for a PWM amplifier in which the aforenoted disadvantages in the prior art are removed.

It is another object of this invention to provide an overload detecting circuit for a PWM amplifier in which the current flowing through the switching circuit is depressed upon detecting the overload condition to decrease the generation of heat in the switching element.

It is still another object of this invention to provide an overload detecting circuit for a PWM amplifier in which clipping of the waveform of the output signal due to the phase difference between the PWM output voltage and output current does not occur.

In accordance with one aspect of the present invention, an overload detecting circuit for a PWM amplifier is provided, which includes a DC voltage source having a pair of terminals; first and second switching elements connected in series between the terminals of the DC voltage source; a signal input circuit for ON/OFF controlling the first and second switching elements, alternatively, in response to an input pulse signal; a low pass filter connected between the connection point of the first and second switching elements and an output terminal adapted to be connected with a load; a first detecting circuit for detecting an output current flowing through the first switching element; a second detecting circuit for detecting an output voltage produced at the output terminal; a first rectifying circuit connected to the second detecting circuit and having a discharge time constant circuit determined by the cut-off frequency of the low pass filter; and a first comparing circuit for comparing the outputs of the first detecting circuit and of the first rectifying circuit and for producing an overload indicative signal in response to the comparison result therebetween.

The other objects, features and advantages of the present invention will be apparent from the following description taken in conjunction with the attached drawings.

DESCRIPTION OF THE PREFERRED EMBODIMENTS

Figure 1:
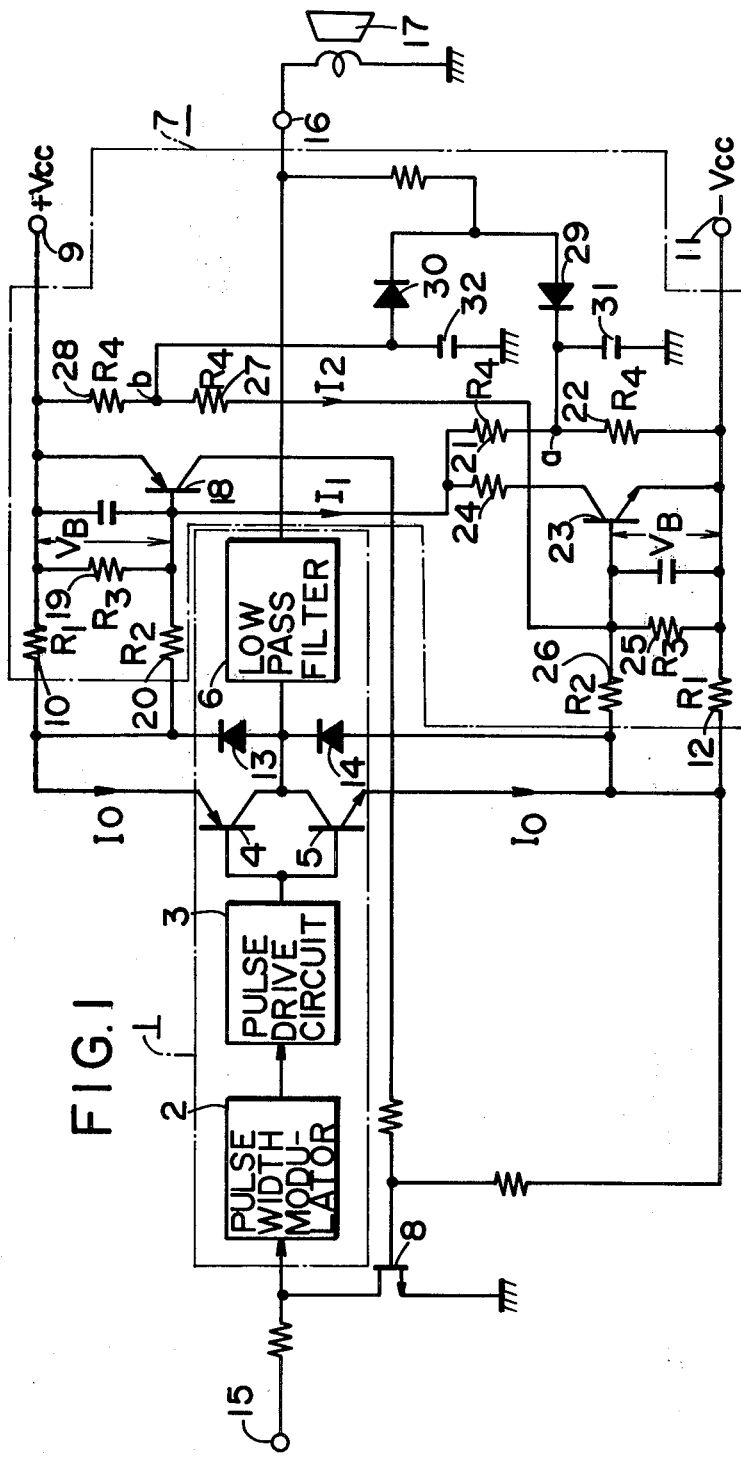
FIG. 1 is a circuit diagram showing a preferred embodiment of this invention.

An overload detecting circuit according to one embodiment of this invention includes a pulse width modulated signal amplifier 1, shown in FIG. 1, consisting of a pulse width modulator 2, a pulse drive circuit 3, a PNP transistor 4 and an NPN transistor 5 for switching for operation, and a low-pass filter 6, an overload detecting circuit 7 and a field effect transistor (FET) 8 for attenuation of an input signal.

A DC voltage +Vcc is supplied to the emitter of the transistor 4 from a power supply terminal 9 through a resistor 10, and a DC voltage −Vcc is supplied to the emitter of the transistor 5 from another power supply terminal 11 through a resistor 12. The filter 6 consists of inductors and capacitors. A reverse voltage of the inductors, induced by the switching operation of the transistors 4 and 5 is absorbed by diodes 13 and 14. The input signal is supplied through an input terminal 15, and an output signal is led out through an output terminal 16 to which a loud speaker 17 is connected as a load of the amplifier.

The overload detecting circuit 7 is constituted as follows.

The emitter of a PNP transistor 18 is connected to the power supply terminal 9 and the collector thereof is connected to the gate of the FET 8. The base of the transistor 18 is connected to one end of the resistor 10 through a resistor 19 and is connected to one end of a resistor 20 whose other end is connected to the other end of the resistor 10. Further, the base of the transistor 18 is connected to the other power supply terminal 11 through a series connection circuit of resistors 21 and 22.

The emitter of an NPN transistor 23 is connected to the terminal 11 and the collector thereof is connected to the base of the transistor 18 through a resistor 24. The base of the transistor 23 is connected to one end of a resistor 12 through a resistor 25 and is connected to one end of a resistor 26 whose other end is connected to another end of the resistor 12. The base of the transistor 23 is connected to the power supply terminal 9 through a series connection circuit of resistors 27 and 28.

When the resistances of the resistors 10 and 12 are represented by $R_1$, resistors 20 and 26 by $R_2$, resistors 19 and 25 by $R_3$ and resistors 21, 22 and 27, 28 by $R_4$, these resistances are set in relation expressed by $R_1<<R_2$ and $R_3<<R_4$. These resistances may have the following values: $R_1 = 0.1 \sim 1\Omega$, $4_2 = 1 \ k\Omega$, $R_3 = 510\Omega$, and $R_4 = 68 \ k\Omega$.

A part of the output signal from the filter 6 is detected through diodes 29 and 30. The signal in positive polarity is supplied to the connecting point a of the series connection of the resistors 21 and 22. The signal in negative polarity is supplied to the connecting point b of the series connection of the resistors 27 and 28. Capacitors 31 and 32 connected respectively between the point a and ground, and point b and ground, operate to eliminate high frequency component in the detected signal for preventing detecting circuit 7 from operating in the high frequency region of the output signal for the reason described below.

The operation of the overload detecting circuit will be described.

In normal operation of the amplifier 1, the input signal supplied from a pre-amplifier through the input terminal 15 is converted to a PWM signal at the pulse width modulator 2. The PWM signal is supplied to the transistors 4 and 5 through the pulse drive circuit 3. These transistors 4 and 5 turn on and off alternately. As a result, an amplified PWM signal of 500 kHz, for example, having peak levels near the supply voltages $\pm$Vcc is obtained at the connecting point of the collectors of the transistors 4 and 5. The PWM signal is supplied to the low-pass filter 6 to be demodulated into an audio signal. An amplified output signal having peak levels near the supply voltages $\pm$Vcc is obtained from the filter 6. The output signal is supplied to the loud speaker 17.

A part of the output signal is supplied to the connecting points a and b respectively through the diodes 29 and 30. On the other hand, to the point a, the power supply voltage +Vcc is supplied, through the circuit consisting of the resistors 10, 19 and 20 and through the resistor 21, and the power supply voltage —Vcc is supplied through the resistor 22. The resistors 21 and 22 have the same resistance $R_4$ as each other, and the resistances $R_1$, $R_2$ and $R_3$ of the resistors 10, 19 and 20 are respectively much less than resistance $R_4$ ($R_1$, $R_2$ and $R_3<<R_4$). In the absence of the output signal, the voltage of the point a is nearly zero. When the output voltage of positive polarity is supplied to the point a through the diode 29, the voltage of the point a changes within the range of nearly 0 to +Vcc in proportion to the positive output voltage.

To the point b, similarly, the power supply +Vcc is supplied through the resistor 28 and the other supply voltage —Vcc is supplied through the circuit consisting of the resistors 12, 25 and 26 and through the resistor 27. The resistors 27 and 28 have the same resistance $R_4$ as each other, and the resistances $R_1$, $R_2$ and $R_3$ of the resistors 12, 25 and 26 are respectively much less than the resistance $R_4$ ($R_1$, $R_2$ and $R_3<<R_4$). Accordingly, when the output voltage of negative polarity is supplied to the point b through the diode 30, the voltage of the point b changes within the range of nearly 0 to —Vcc in proportion to the negative output voltage.

Currents $I_1$ and $I_2$ respectively flow through the resistors 21 and 27 in accordance with the variation of voltage at the points a and b. The currents $I_1$ and $I_2$ are nearly zero when the voltage of the output signal is $\pm$Vcc, and they reach almost maximum value Vcc/$R_4$, when the voltage of the output signal is zero, because of the fact: $R_1$, $R_2$ and $R_3<<R_4$. Thus, the currents $I_1$ and $I_2$ vary from the maximum Vcc/$R_4$ to zero in accordance with the output voltage. On the other hand, the transistors 4 and 5 connected between the power supply terminals 9 and 11 alternately become conductive to produce a switching current $I_0$ which flows alternately through the resistors 10 and 12. The current $I_0$ varies almost from zero to a maximum output current Vcc/$R_1$ in proportion to the output signal, in contrast with the variation of the currents $I_1$ and $I_2$ varying almost from the maximum to zero.

When a loudspeaker 17 having a lower input impedance than a rating of the amplifier is connected or the loudspeaker 17 is shorted, the current $I_0$ increases and the amplifier 1 runs into an overload condition. Under that condition, the voltage at the output terminal 16 falls nearly to zero. Therefore, the voltages at the points a and b fall nearly to zero, too, which makes the currents $I_1$ and $I_2$ flow at their maximum values.

The voltage across the resistor 19, i.e., the base voltage $V_B$, is the sum of a voltage ($I_0R_1 \times [R_3/R_2+R_3]$) yielded by the current $I_0$ and a voltage ($I_1 \times [R_2R_3/R_2+R_3]$); because the circuit consisting of the resistors 10, 19 and 20 is regarded as a parallel connection of the resistors $R_2$ and $R_3$. Thus, the voltage $V_B$ is expressed as follows:

$$V_B = (I_1 \times [R_2R_3/R_2+R_3]) + (I_0R_1 \times [R_3/R_2+R_3]) \qquad (1)$$

In the overload condition of the amplifier, the currents $I_1$ and $I_0$ in the expression (1) increase to cause a condition: $V_B \geqq V_{BE}$, in which $V_{BE}$ represents a voltage across the base and emitter of the transistor 18, that is, for instance, about 0.6 V. As a result, the transistor 18 turns on.

In the same way, the current $I_0$ of the transistor 5 and the current $I_2$ yield a voltage $V_B$ across the resistor 25 in accordance with a similar expression to (1). The voltage $V_B$ in the overload condition makes the transistor 23 conductive, which causes a current to flow through the resistor 24. As a result, the current $I_1$ increases to turn on the transistor 18. The turning sequence of the transistor 18, due to the current $I_1$ and due to the turning-on of the transistor 23, is determined by the timing of switching action of the transistors 4 and 5.

Thus, in the overload condition, the transistor 18 turns on to generate a signal, which is supplied to the gate of the FET 8. The FET 8 turns on to attenuate the level of the input signal, which causes the transistors 4 and 5 to stop the switching operation. The amplifier 1 turns into a condition similar to the condition that the input signal is not supplied thereto.

Accordingly, the transistors 4 and 5 are kept away from the overload condition.

Figure 2:
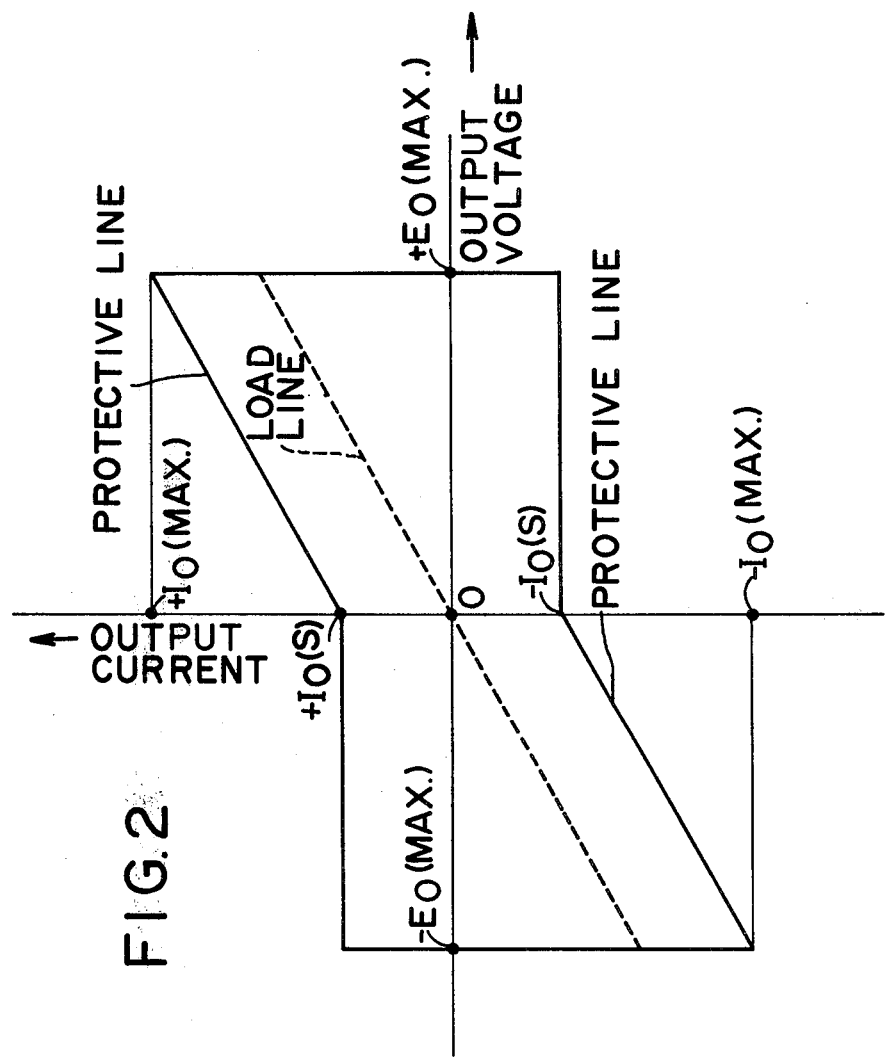
FIG. 2 is a graph for explanation of operation of this invention.

According to this invention, as shown in FIG. 2, the output current is limited to $\pm I_0(s)$ in the overload condition such as short circuit of the output terminal of the amplifier. A protective line is formed on the basis of the current $\pm I_0(s)$ and rated maximum currents $\pm I_0$ (max) at maximum output voltage $\pm E_0$ in normal operation of the amplifier. The amplifier operates inside the protective line, and is protected from overload outside the protective line. Thus, the rated maximum current $I_0$ (max) flows in the amplifier with the conventional overload detecting circuit in the overload condition. On the other hand, the current can be decreased to $I_0(s)$ in accordance with this invention. The heat generation of the switching element can be decreased.

In the operation of normal load, the amplifier can normally operate when the phase of the PWM signal at the collectors of the transistors 4 and 5 matches with the phase of the output signal, i.e., the phase of the voltages at the points a and b. Since the filter 6, however, consists of inductors and capacitors, a certain phase difference is produced between the PWM output current and the output voltage. As the phase difference is small in lower frequency region of the output signal, the amplifier operates normally in the lower frequency region. The phase difference increases in higher frequency region. As a result, when the voltage of the point a falls nearly to zero to bring the current $I_1$ to a maximum, then the transistor 4 turns on, a little current $I_1$ flows through the transistor 4. The PWM signal at the collector is clipped, so that the level of the output signal is clipped.

In this embodiment, capacitors 31 and 32 having a small capacitance are respectively connected to the diodes 29 and 30, in order to prevent the output signal from clipping in the higher frequency region. The capacitors 31 and 32 are charged in the higher frequency region, so that the voltages at the points a and b increase to the charging voltages of the capacitors 31 and 32. Accordingly, the increase of the currents $I_1$ and $I_2$ is suppressed, and the current $I_0$ flows sufficiently. Thus, as the sensitivity of the overload detecting circuit 7 is lowered in the higher frequency region, a clip of the output level caused by the filter 6 which produces phase difference between the PWM signal and the output signal, is prevented.

The capacitance of the capacitors 31 and 32 and the resistances of the resistors 22 and 28 are so determined that the voltages at the points a and b rise to a predetermined value when the frequency of the output signal reaches a predetermined frequency which is lower than the cut-off frequency of the filter 6. The time constant Td may be selected as follows:

$$Td = R_4 \cdot C_{31} > (1/f\alpha)$$

in which $f_{60}$ stands for the cut-off frequency of the filter 6, $R_4$ for the resistance of the resistor 22 and $C_{31}$ for the capacitance of the capacitor 31.

While there has been described preferred embodiments of the invention, obviously further modifications and variations are possible in the light of the above teachings. It is understood, therefore, that within the scope of the appended claims, the invention may be practiced otherwise than as specifically described.

I claim as my invention:

1. An overload detecting circuit for a PWM amplifier comprising:
   (a) a DC voltage source having a pair of terminals;
   (b) first and second switching means connected in series between the terminals of said DC voltage source;
   (c) signal input means for ON/OFF controlling said first and second switching means, alternatively, in response to an input pulse signal;
   (d) a low pass filter connected between the connection point of said first and second switching means and an output terminal adapted to be connected with a load;
   (e) first detecting means for detecting an output current flowing through said first switching means;
   (f) second detecting means for detecting an output voltage produced at said output terminal;
   (g) first rectifying means connected to said second detecting means and having a discharge time constant circuit determined by the cut-off frequency of said low pass filter; and
   (h) first comparing means for comparing the outputs of said first detecting means and of said first rectifying means and for producing an overload indicative signal in response to the comparison result therebetween.

2. An overload detecting circuit for a PWM amplifier according to claim 1, in which the discharge time constant is larger than the time constant determined by the reciprocal of the cut-off frequency of said low pass filter.

3. An overload detecting circuit for a PWM amplifier according to claim 2, in which said first detecting means comprises first, second and third resistors, said first resistor being connected between one of the terminals of said DC voltage source and said first switching means, a series connection of said second and third resistors being connected in parallel with said first resistor.

4. An overload detecting circuit for a PWM amplifier according to claim 3, in which said rectifying means comprises a series circuit of a first diode and first capacitor, said series circuit being connected between said output terminal and a reference point; and a series circuit of fourth and fifth resistors, said series circuit being connected between the connection point of said second and third resistors and said second terminal of said DC voltage source, the connection point of said fourth and fifth resistors being connected to the connection point of said first diode and first capacitor, and said first capacitor and said fifth resistor forming said discharge time constant circuit of said rectifying means.

5. An overload detecting circuit for a PWM amplifier according to claim 4, in which said first comparing means comprises a first switching transistor having base, emitter and collector, the base and emitter circuit of which is connected across said third resistor and the collector of which produces said overload indicative signal when said first switching transistor becomes conductive.

6. An overload detecting circuit for a PWM amplifier according to claim 5, which further includes input attenuating means connected to said signal input means and controlled by said first switching transistor so as to decrease the input signal when said first switching transistor becomes conductive.

7. An overload detecting circuit for a PWM amplifier according to claim 6, in which said input attenuating means comprises a field effect transistor.

8. An overload detecting circuit for a PWM amplifier according to claim 5, which further includes a third detecting means for detecting an output current flowing through said second switching means, fourth detecting means for detecting an output voltage produced at said output terminal, second rectifying means connected to said fourth detecting means and having a discharge time constant circuit determined by the cut-off frequency of said low pass filter, and second comparing means for comparing the outputs of said third detecting means and of said second rectifying means and for controlling said first switching transistor in response to the comparison result therebetween.

* * * * *